(12) United States Patent
Lu et al.

(10) Patent No.: US 11,615,921 B2
(45) Date of Patent: Mar. 28, 2023

(54) CAPACITOR AND MANUFACTURING METHOD THEREFOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 331 days.

(21) Appl. No.: 17/024,257

(22) Filed: Sep. 17, 2020

(65) Prior Publication Data

US 2021/0005393 A1  Jan. 7, 2021

Related U.S. Application Data

(63) Continuation of application No. PCT/CN2019/078758, filed on Mar. 19, 2019.

(51) Int. Cl.
*H01G 4/35* (2006.01)
*H01G 4/005* (2006.01)
(Continued)

(52) U.S. Cl.
CPC .............. *H01G 4/35* (2013.01); *H01G 4/005* (2013.01); *H01L 28/65* (2013.01); *H01L 28/75* (2013.01);
(Continued)

(58) Field of Classification Search
CPC ............ H01G 4/35; H01G 4/005; H01G 4/38; H01G 4/12; H01G 4/10; H01G 4/01;
(Continued)

(56) References Cited

U.S. PATENT DOCUMENTS 8,405,135 B2  3/2013  Yang et al.
8,471,363 B2  6/2013  Asami et al.
(Continued)

FOREIGN PATENT DOCUMENTS

CN   102569250 A    7/2012
CN   103346141 A   10/2013
(Continued)

*Primary Examiner* — Michael P Mcfadden
(74) *Attorney, Agent, or Firm* — Scully Scott Murphy & Presser

(57) ABSTRACT

A capacitor includes: a substrate; a first trench entering the substrate downward from the upper surface of the substrate; a laminated structure provided in the first trench and including m dielectric layers and n conductive layers, the m dielectric layers and the n conductive layers forming a structure that a conductive layer and a dielectric layer are adjacent to each other, each dielectric layer of the m dielectric layers including at least one high-k insulating material with a relative dielectric constant k greater than a first threshold value, and each conductive layer of the n conductive layers including at least one high work function conductive material with a work function greater than a second threshold value, where m and n are positive integers; and a first electrode electrically connected to all odd-numbered conductive layers, and a second electrode electrically connected to all even-numbered conductive layers.

15 Claims, 7 Drawing Sheets

(51) Int. Cl.
*H01L 29/66* (2006.01)
*H01L 29/94* (2006.01)
*H01L 49/02* (2006.01)

(52) U.S. Cl.
CPC ...... *H01L 29/66181* (2013.01); *H01L 29/945* (2013.01)

(58) Field of Classification Search
CPC ......... H01G 28/60; H01L 28/65; H01L 28/75; H01L 29/66181; H01L 29/945; H05K 1/162; H05K 1/18; H05K 2201/10015
See application file for complete search history.

(56) References Cited

U.S. PATENT DOCUMENTS

| | | | |
|---|---|---|---|
| 8,609,504 | B2 | 12/2013 | Yang et al. |
| 8,779,491 | B2 | 7/2014 | Yang et al. |
| 9,196,672 | B2 | 11/2015 | Tran et al. |
| 9,520,462 | B1 | 12/2016 | Tran et al. |
| 9,608,130 | B2 | 3/2017 | Tran et al. |
| 9,793,340 | B2 | 10/2017 | Voiron et al. |
| 2004/0046196 | A1* | 3/2004 | Kim ........................ H01L 28/65 257/296 |
| 2004/0129961 | A1* | 7/2004 | Paz de Araujo ...... H01L 23/642 257/295 |
| 2012/0044612 | A1 | 2/2012 | Besling et al. |
| 2012/0080771 | A1 | 4/2012 | Yang et al. |
| 2012/0080772 | A1 | 4/2012 | Asami et al. |
| 2013/0161791 | A1 | 6/2013 | Yang et al. |
| 2013/0161792 | A1 | 6/2013 | Tran et al. |
| 2013/0164905 | A1 | 6/2013 | Yang et al. |
| 2013/0175665 | A1 | 7/2013 | Chudzik et al. |
| 2013/0175666 | A1* | 7/2013 | Tran ........................ H01L 28/40 257/532 |
| 2015/0044853 | A1 | 2/2015 | Chudzik et al. |
| 2016/0233025 | A1* | 8/2016 | Masuda .................. H01G 4/06 |
| 2017/0053979 | A1 | 2/2017 | Voiron et al. |
| 2017/0104057 | A1* | 4/2017 | Voiron ................ H01L 27/0805 |
| 2017/0213896 | A1* | 7/2017 | Lisiansky ............... H01L 28/87 |
| 2018/0061573 | A1* | 3/2018 | Shin ........................ H01L 28/60 |

FOREIGN PATENT DOCUMENTS

| | | |
|---|---|---|
| CN | 102569250 B | 3/2014 |
| CN | 106170858 A | 11/2016 |

* cited by examiner

200

Producing a first trench and a second trench on a substrate, where the first trench and the second trench enter the substrate downward from an upper surface of the substrate ~ 201

Producing a laminated structure above the substrate and in the first trench and the second trench, where the laminated structure includes m dielectric layer(s) and n conductive layers, the m dielectric layer(s) and the n conductive layers form a structure that a conductive layer and a dielectric layer are adjacent to each other so that a corresponding dielectric layer of the m dielectric layer(s) isolates the n conductive layers from each other, each of the m dielectric layer(s) includes at least one high-k insulating material with a relative dielectric constant k greater than or equal to a first threshold value, and each conductive layer of the n conductive layers includes at least one high work function conductive material with a work function greater than or equal to a second threshold value, where m and n are positive integers ~ 202

Producing a first electrode, a second electrode, a third electrode and a fourth electrode, where the first electrode is electrically connected to all odd-numbered conductive layer(s) of the n conductive layers located in the first trench, the second electrode is electrically connected to an even-numbered conductive layer(s) of the n conductive layers located in the first trench, the third electrode is electrically connected to the all odd-numbered conductive layer(s) of the n conductive layers located in the second trench, and the fourth electrode is electrically connected to the even-numbered conductive layer(s) of the n conductive layers located in the second trench ~ 203

FIG. 4

CAPACITOR AND MANUFACTURING METHOD THEREFOR

CROSS-REFERENCE TO RELATED APPLICATIONS

The present disclosure is a continuation of International Application No. PCT/CN2019/078758, filed on Mar. 19, 2019, the disclosure of which is hereby incorporated by reference in its entirety.

TECHNICAL FIELD

The present disclosure relates to the field of capacitors, and more particularly, to a capacitor and a manufacturing method therefor.

BACKGROUND

A capacitor can play a role of bypassing, filtering, decoupling, or the like in a circuit, which is an indispensable part for ensuring a normal operation of the circuit. As modern electronic systems continue to develop towards multi-functions, high integration, low power consumption and microminiaturization, the existing capacitor manufacturing techniques are already difficult to meet diverse needs of various high-end applications.

A wafer-level three-dimensional (3D) capacitor is a novel capacitor manufactured on a silicon wafer using semiconductor processing techniques in recent years, and it usually adopts heavily doped silicon as a plate of the capacitor, and a silicon nitride and oxide as a dielectric of the capacitor. However, resistivity of the heavily doped silicon is great, resulting in a great equivalent series resistance of the capacitor so that the loss of the capacitor is great. Moreover, dielectric constants of the silicon nitride and oxide are low so that a capacitance density is low. How to improve a capacitance value density of a capacitor is a technical problem to be solved urgently.

SUMMARY

The present disclosure provides a capacitor and a manufacturing method therefor, which could optimize performance of the capacitor and improve a capacitance value density of the capacitor.

In a first aspect, a capacitor is provided, the capacitor including:

a substrate including an upper surface and a lower surface disposed oppositely;

a first trench provided in the substrate and entering the substrate downward from the upper surface;

a laminated structure provided above the substrate and in the first trench, the laminated structure including m dielectric layer(s) and n conductive layers, the m dielectric layer(s) and the n conductive layers forming a structure that a conductive layer and a dielectric layer are adjacent to each other so that a corresponding dielectric layer of the m dielectric layer(s) electrically isolates the n conductive layers from each other, each of the m dielectric layer(s) including at least one high-k insulating material with a relative dielectric constant k greater than or equal to a first threshold value, and each conductive layer of the n conductive layers including at least one high work function conductive material with a work function greater than or equal to a second threshold value, where m and n are positive integers;

a first electrode electrically connected to all odd-numbered conductive layer(s) of the n conductive layers; and a second electrode electrically connected to all even-numbered conductive layer(s) of the n conductive layers.

Therefore, in a capacitor provided in an embodiment of the present disclosure, a laminated structure that a conductive layer and a dielectric layer are alternately stacked is adopted and provided above a substrate and in a first trench, which could obtain a great capacitance value in a case of a small device size, thereby improving a capacitance value density of the capacitor.

Further, in the laminated structure, each dielectric layer includes at least one high-k insulating material with a relative dielectric constant k greater than or equal to a first threshold value, and each conductive layer includes at least one high work function conductive material with a work function greater than or equal to a second threshold value, thereby improving performance of the capacitor.

It should be noted that, in the laminated structure, an order of m dielectric layers may be: an ascending or descending order of distances to the substrate in the trench. Similarly, an order of n conductive layers may also be: an ascending or descending order of distances to the substrate in the trench. For ease of description, in the embodiment of the present disclosure, the orders of the m dielectric layers and the n conductive layers are described by an example of the ascending orders of the distances to the substrate in the trench.

In some possible implementation manners, in the laminated structure, the each conductive layer is in direct contact with the dielectric layer through the high work function conductive material included therein.

In some possible implementation manners, the first threshold value is 9.

In some possible implementation manners, the second threshold value is 4.9 eV.

In some possible implementation manners, the high-k insulating material includes at least one of:

$Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, and calcium copper titanate ($CaCu_3Ti_4O_{12}$, CCTO).

In some possible implementation manners, the high work function conductive material includes at least one of:

platinum (Pt), iridium (Ir), nickel (Ni), gold (Au), cobalt (Co), rhodium (Rh), osmium (OS), beryllium (Be), palladium (Pd), platinum silicide, iridium silicide, nickel silicide, gold silicide, cobalt silicide, rhodium silicide, osmium silicide, beryllium silicide, and palladium silicide.

In some possible implementation manners, the each conductive layer of the n conductive layers further includes at least one of:

a conductive material used as an adhesion layer and/or a barrier layer, and a metal of tungsten and/or copper for increasing a thickness of a conductive layer.

Optionally, the conductive material used as an adhesion layer and/or a barrier layer includes at least one of:

titanium nitride (TiN), tantalum nitride (TaN), titanium aluminum nitride (TiAlN), tantalum silicon nitride (TaSiN), tantalum carbon nitride (TaCN), ruthenium (Ru), ruthenium oxide ($RuO_2$), Iridium oxide ($IrO_2$), and platinum oxide ($PtO_x$).

In some possible implementation manners, the capacitor further includes:

a substrate insulating layer provided between the laminated structure and the substrate.

In some possible implementation manners, the first electrode is electrically connected to all the odd-numbered conductive layer(s) of the n conductive layers through at least one first via structure.

In some possible implementation manners, the second electrode is electrically connected to all the even-numbered conductive layer(s) of the n conductive layers through at least one second via structure.

In some possible implementation manners, the capacitor further includes:

an interconnection structure for electrically connecting all the odd-numbered conductive layer(s) of the n conductive layers to the first electrode, and/or electrically connecting all the even-numbered conductive layer(s) of the n conductive layers to the second electrode.

In some possible implementation manners, the capacitor further includes an electrode layer, where the electrode layer is provided above the laminated structure and the substrate, the electrode layer includes a first conductive region and a second conductive region separated from each other, the first conductive region forms the first electrode, and the second conductive region forms the second electrode.

Optionally, the first conductive region and the second conductive region are isolated by air.

In some possible implementation manners, the first electrode is provided below the substrate, and the second electrode is provided above the laminated structure and the substrate.

In some possible implementation manners, the capacitor further includes: a second trench, a third electrode, and a fourth electrode, where the second trench is provided in the substrate and enters the substrate downward from the upper surface;

the laminated structure is further provided in the second trench, and there is no conductive layer electrically connected between the laminated structure provided in the second trench and the laminated structure provided in the first trench, or there is a conductive layer partially electrically connected between the laminated structure provided in the second trench and the laminated structure provided in the first trench; and the third electrode is electrically connected to all the odd-numbered conductive layer(s) of the n conductive layers provided in the second trench, and the fourth electrode is electrically connected to all the even-numbered conductive layer(s) of then conductive layers provided in the second trench.

In some possible implementation manners, the third electrode and the first electrode are the same electrode, and the fourth electrode and the second electrode are the same electrode; or the third electrode and the first electrode are different electrodes, and the fourth electrode and the second electrode are the same electrode; or the third electrode and the first electrode are the same electrode, and the fourth electrode and the second electrode are different electrodes; or the third electrode and the first electrode are different electrodes, and the fourth electrode and the second electrode are different electrodes.

In a second aspect, a manufacturing method for a capacitor is provided, including:

producing a first trench on a substrate, where the first trench enters the substrate downward from an upper surface of the substrate;

producing a laminated structure above the substrate and in the first trench, where the laminated structure includes m dielectric layer(s) and n conductive layers, the m dielectric layer(s) and the n conductive layers form a structure that a conductive layer and a dielectric layer are adjacent to each other so that a corresponding dielectric layer of the m dielectric layer(s) electrically isolates the n conductive layers from each other, each of the m dielectric layer(s) includes at least one high-k insulating material with a relative dielectric constant k greater than or equal to a first threshold value, and each conductive layer of the n conductive layers includes at least one high work function conductive material with a work function greater than or equal to a second threshold value, where m and n are positive integers; and producing a first electrode and a second electrode, where the first electrode is electrically connected to all odd-numbered conductive layer(s) of the n conductive layers, and the second electrode is electrically connected to all even-numbered conductive layer(s) of the n conductive layers.

Therefore, in a manufacturing method for a capacitor provided in an embodiment of the present disclosure, a laminated structure including more conductive layers and dielectric layers may be obtained by means of producing a laminated structure, and a capacitance value of the capacitor is increased. Further, in the laminated structure, each dielectric layer includes at least one high-k insulating material with a relative dielectric constant k greater than or equal to a first threshold value, and each conductive layer includes at least one high work function conductive material with a work function greater than or equal to a second threshold value, thereby improving improve performance of the capacitor.

Optionally, the substrate is etched by deep reactive ion etching (DRIE) to form at least one trench in the substrate.

In some possible implementation manners, in the laminated structure, the each conductive layer is in direct contact with the dielectric layer through the high work function conductive material included therein.

In some possible implementation manners, the first threshold value is 9.

In some possible implementation manners, the second threshold value is 4.9 eV.

In some possible implementation manners, before producing the laminated structure, the method further includes:

depositing a substrate insulating layer on the upper surface of the substrate and an inner surface of the first trench; and the producing the laminated structure above the substrate and in the first trench includes:

producing the laminated structure on an upper surface and an inner surface of the substrate insulating layer.

In some possible implementation manners, the method further includes:

producing at least one first via structure so that the first electrode is electrically connected to all the odd-numbered conductive layer(s) of the n conductive layers through the at least one first via structure.

In some possible implementation manners, the method further includes:

producing at least one second via structure so that the second electrode is electrically connected to all the even-numbered conductive layer(s) of then conductive layers through the at least one second via structure.

In some possible implementation manners, the method further includes:

producing an interconnection structure so that all the odd-numbered conductive layer(s) of the n conductive layers is electrically connected to the first electrode, and/or all the even-numbered conductive layer(s) of the n conductive layers is electrically connected to the second electrode.

In some possible implementation manners, the producing the first electrode and the second electrode includes:

producing an electrode layer above the laminated structure and the substrate, where the electrode layer includes a first conductive region and a second conductive region separated from each other, the first conductive region forms the first electrode, and the second conductive region forms the second electrode.

In some possible implementation manners, the producing the first electrode and the second electrode includes:

producing the first electrode below the substrate, and producing the second electrode above the laminated structure and the substrate.

In some possible implementation manners, the method further includes:

producing a second trench on the substrate, where the second trench enters the substrate downward from the upper surface of the substrate;

producing the laminated structure above the substrate and in the second trench, where there is no conductive layer electrically connected between the laminated structure located in the second trench and the laminated structure located in the first trench, or there is a conductive layer partially electrically connected between the laminated structure located in the second trench and the laminated structure located in the first trench; and producing a third electrode and a fourth electrode, where the third electrode is electrically connected to all the odd-numbered conductive layer(s) of the n conductive layers located in the second trench, and the fourth electrode is electrically connected to the even-numbered conductive layer(s) of the n conductive layers located in the second trench.

In some possible implementations, the third electrode and the first electrode are the same electrode, and the fourth electrode and the second electrode are the same electrode; or the third electrode and the first electrode are different electrodes, and the fourth electrode and the second electrode are the same electrode; or the third electrode and the first electrode are the same electrode, and the fourth electrode and the second electrode are different electrodes; or the third electrode and the first electrode are different electrodes, and the fourth electrode and the second electrode are different electrodes.

BRIEF DESCRIPTION OF DRAWINGS

FIG. 4 is a schematic flow chart of a manufacturing method for a capacitor according to an embodiment of the present disclosure.

DESCRIPTION OF EMBODIMENTS

Technical solutions in embodiments of the present disclosure will be described hereinafter with reference to accompanying drawings.

It should be understood that a capacitor of an embodiment of the present disclosure can play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, long lifetime, and the like. In a basic processing flow, a 3D structure with a high aspect ratio, such as a deep hole (Via), a trench, a pillar shape (Pillar), or a wall shape (Wall), is required to be first processed on a wafer or substrate, and then an insulating thin film and a low-resistivity conductive material are deposited on a surface of the 3D structure to manufacture a lower electrode, an dielectric layer and an upper electrode of the capacitor, sequentially.

For a 3D silicon capacitor at the present stage, based on some concepts of multi-layer nesting in the manufacture of a DRAM, conductor and insulator materials are deposited alternately on a surface of a 3D structure to form a structure where a plurality of capacitors are vertically stacked, and then all the capacitors are connected in parallel by different connection manners on a front side of a silicon substrate to finally form a capacitor with a large capacitance value. However, a capacitance value density of a current wafer-level 3D capacitor is still limited. Moreover, the current wafer-level 3D capacitor usually adopts heavily doped silicon as a plate of the capacitor, and a silicon nitride and a silicon oxide as a dielectric of the capacitor. However, resistivity of the heavily doped silicon is great (about 1 mΩ·cm), which is about 10,000 to 100,000 times that of metal, an equivalent series resistance (ESR) of the capacitor is directly related to resistivity of the plate of the capacitor, the greater the ESR is, and the higher the loss of the capacitor is; and dielectric constants of the silicon nitride and the silicon oxide are low so that a capacitance density is low.

In this context, the present disclosure proposes a structure and manufacturing method for a novel capacitor, which could improve a capacitance value density of the capacitor and optimize performance of the capacitor.

A capacitor according to an embodiment of the present disclosure will be introduced in detail hereinafter with reference to FIG. 1 to FIG. 3.

Figure 1:
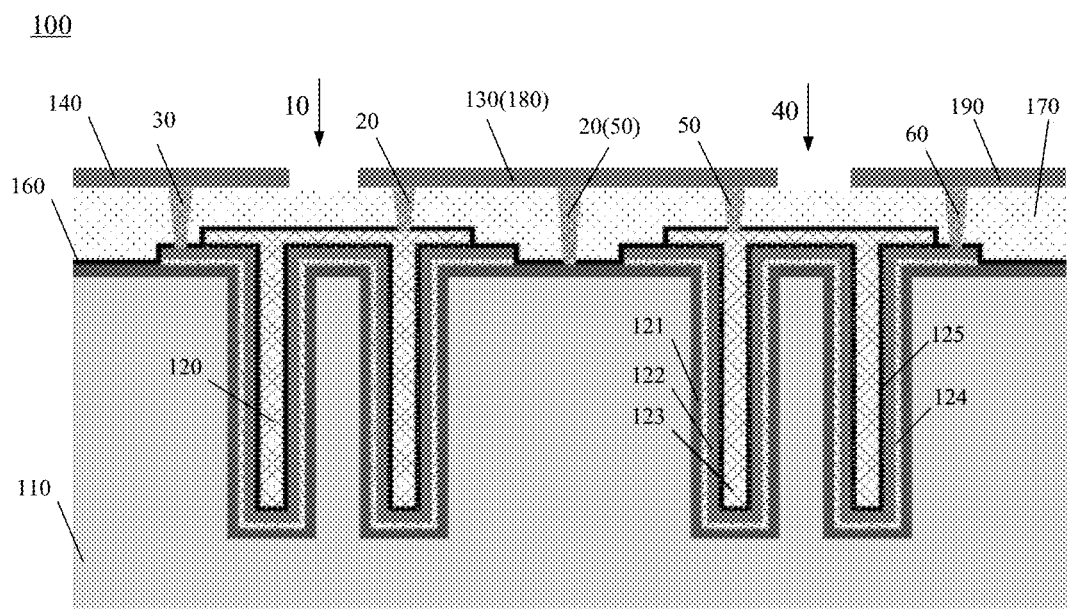
FIG. 1 is a schematic structural diagram of a capacitor according to an embodiment of the present disclosure.
Figure 2:
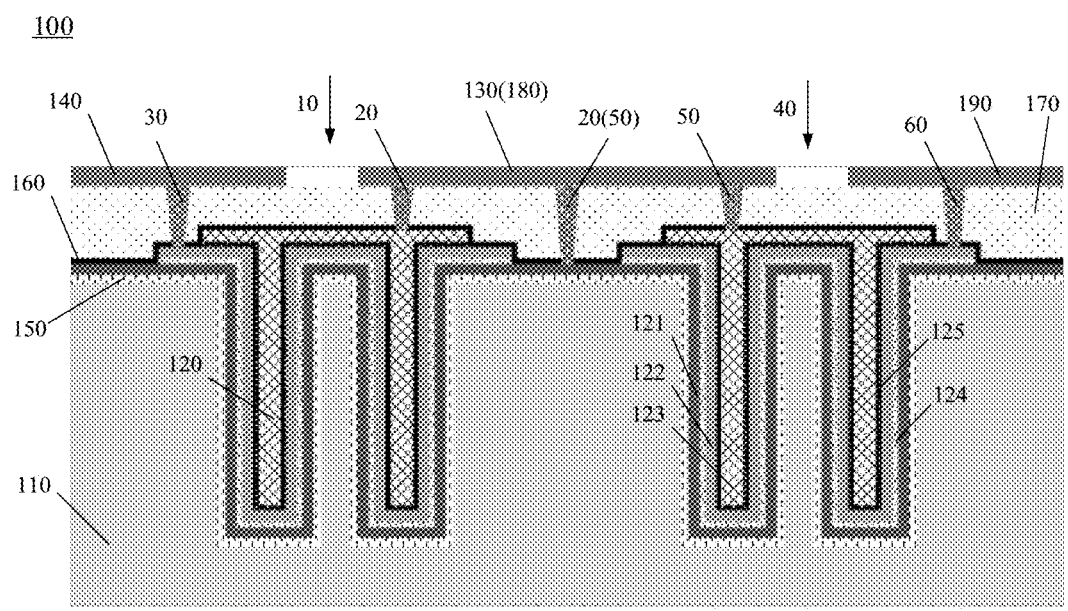
FIG. 2 is a schematic structural diagram of another capacitor according to an embodiment of the present disclosure.
Figure 3:
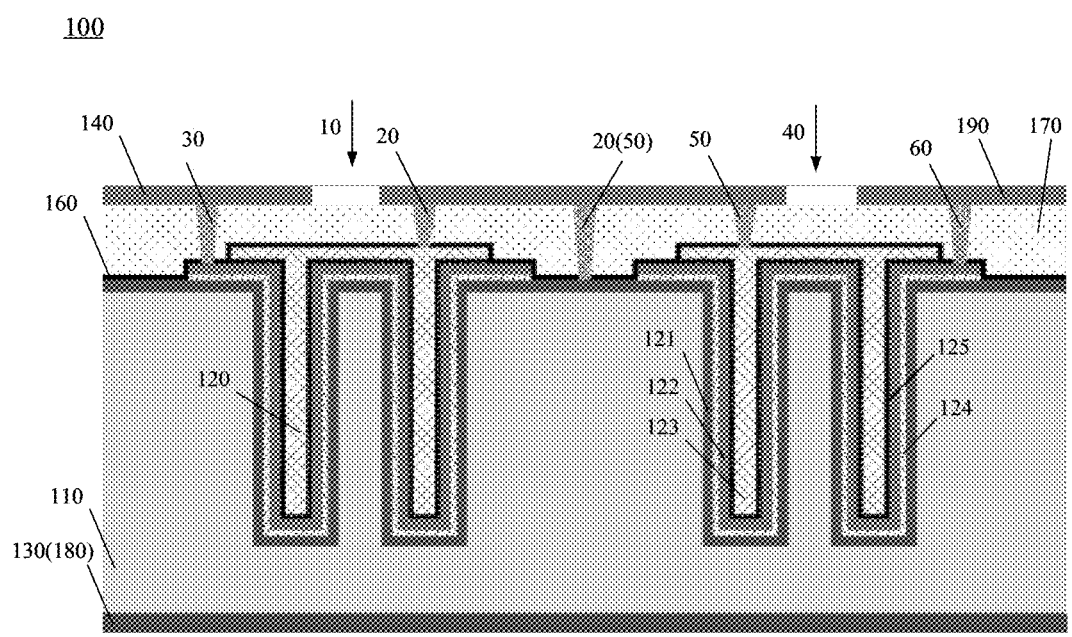
FIG. 3 is a schematic structural diagram of yet another capacitor according to an embodiment of the present disclosure.

It should be understood that capacitors in FIG. 1 to FIG. 3 are merely examples, and the number of trenches included in a capacitor is not limited to that shown in the capacitors of FIG. 1 to FIG. 3, and may be determined according to actual needs. Meanwhile, in embodiments of FIG. 1 to FIG. 3, an extending direction of a trench is described by an example of a direction perpendicular to a substrate (wafer). In the embodiments of the present disclosure, the extending direction of the trench may also be some other directions, for example, all directions satisfying that an angle with respect to the direction perpendicular to the substrate (wafer) is less than a preset value.

It should be noted that in embodiments shown below, for structures shown in different embodiments, same structures are denoted by same reference numerals for ease of understanding, and detailed description of the same structures is omitted for brevity.

FIG. 1 is a possible structural diagram of a capacitor 100 according to an embodiment of the present disclosure. As shown in FIG. 1, the capacitor 100 includes a substrate 110, a laminated structure 120, a first electrode 130, and a second electrode 140.

Specifically, as shown in FIG. 1, in the capacitor 100, the substrate 110 includes an upper surface and a lower surface disposed oppositely; a first trench 10 is provided in the substrate 110, the first trench 10 entering the substrate 110 downward from the upper surface of the substrate 110; the laminated structure 120 is provided above the substrate 110 and in the trench 10, the laminated structure 120 including m dielectric layer(s) and n conductive layers, the m dielectric layer(s) and the n conductive layers forming a structure that a conductive layer and a dielectric layer are adjacent to each other so that a corresponding dielectric layer of the m dielectric layer(s) electrically isolates the n conductive layers from each other, each of the m dielectric layer(s) including at least one high-k insulating material with a relative dielectric constant k greater than or equal to a first threshold value, and each conductive layer of the n conductive layers including at least one high work function conductive material with a work function greater than or equal to a second threshold value, where m and n are positive integers; the first electrode 130 is electrically connected to all odd-numbered conductive layer(s) of the n conductive layers; and the second electrode 140 is electrically connected to all even-numbered conductive layer(s) of the n conductive layers.

That is, in the embodiment of the present disclosure, two adjacent conductive layers of the n conductive layers are electrically isolated. Moreover, the specific values of m and n may be flexibly configured according to actual needs, as long as electrical isolation between two adjacent conductive layers of the n conductive layers is satisfied.

It should be noted that, in the embodiment of the present disclosure, a laminated structure that a conductive layer and a dielectric layer are alternately stacked is adopted, which could obtain a great capacitance value in a case of a small device size, thereby improving a capacitance value density of the capacitor. Further, in the laminated structure, each dielectric layer includes at least one high-k insulating material with a relative dielectric constant k greater than or equal to a first threshold value, and each conductive layer includes at least one high work function conductive material with a work function greater than or equal to a second threshold value, thereby improving performance of the capacitor.

Optionally, in the embodiment of the present disclosure, the substrate 110 may be a silicon wafer, including monocrystalline silicon, polycrystalline silicon, and amorphous silicon. The substrate 110 may also be another semiconductor substrate, including an SOI wafer, or a compound semiconductor wafer of an III-V group element, such as silicon carbide (SiC), gallium nitride (GaN), or gallium arsenide (GaAs); a glass substrate; or an organic polymer substrate.

It should be noted that, in the laminated structure, an order of the m dielectric layer(s) may be: an ascending or descending order of distances to the substrate in the trench. Similarly, an order of the n conductive layers may also be: an ascending or descending order of distances to the substrate in the trench. For ease of description, in the embodiment of the present disclosure, the orders of the m dielectric layer(s) and the n conductive layers are described by an example of the ascending orders of the distances to the substrate in the trench.

Optionally, in the embodiment of the present disclosure, the capacitor 100 further includes a second trench 40, a third electrode 180, and a fourth electrode 190.

Specifically, as shown in FIG. 1, the second trench 40 is provided in the substrate 110 and enters the substrate 110 downward from the upper surface of the substrate 110; and the laminated structure 120 is further provided in the second trench 40, and there is a conductive layer partially electrically connected between the laminated structure 120 provided in the second trench 40 and the laminated structure 120 provided in the first trench 10. The third electrode 180 is electrically connected to all the odd-numbered conductive layer(s) of the n conductive layers provided in the second trench 40, and the fourth electrode 190 is electrically connected to all the even-numbered conductive layer(s) of the n conductive layers provided in the second trench 40.

Optionally, there may be no conductive layer electrically connected between the laminated structure 120 provided in the second trench 40 and the laminated structure 120 provided in the first trench 10. That is, the laminated structure 120 provided in the second trench 40 is completely independent from the laminated structure 120 provided in the first trench 10.

Optionally, the third electrode 180 and the first electrode 130 are the same electrode, and the fourth electrode 190 and the second electrode 140 are the same electrode. That is, an equivalent capacitance formed by the laminated structure 120 provided in the first trench 10 and an equivalent capacitance formed by the laminated structure 120 provided in the second trench 40 are connected in parallel.

Optionally, the third electrode 180 and the first electrode 130 are different electrodes, and the fourth electrode 190 and the second electrode 140 are the same electrode. That is, an equivalent capacitance formed by the laminated structure 120 provided in the first trench 10 and an equivalent capacitance formed by the laminated structure 120 provided in the second trench 40 are connected in series.

Optionally, the third electrode 180 and the first electrode 130 are the same electrode, and the fourth electrode 190 and the second electrode 140 are different electrodes. That is, an equivalent capacitance formed by the laminated structure 120 provided in the first trench 10 and an equivalent capacitance formed by the laminated structure 120 provided in the second trench 40 are connected in series.

Optionally, the third electrode 180 and the first electrode 130 are different electrodes, and the fourth electrode 190 and the second electrode 140 are different electrodes. That is, an equivalent capacitance formed by the laminated structure 120 provided in the first trench 10 and an equivalent capacitance formed by the laminated structure 120 provided in the second trench 40 are two independent capacitors.

It should be noted that, in the embodiment of the present disclosure, the capacitor 100 may include more trenches, the provision manner of which may refer to the second trench 40. Certainly, the capacitor 100 may also include more electrodes, the connection manner of which with the laminated structure 120 in the trenches may refer to the third electrode 180 and the fourth electrode 190, which will not be repeated redundantly herein for brevity.

It should be noted that the embodiment of the present disclosure is described by an example that there are the first trench 10 and the second trench 40 at the same time, and only by an example that the third electrode 180 and the first electrode 130 are the same electrode and the fourth electrode 190 and the second electrode 140 are different electrodes.

In the embodiment of the present disclosure, shapes of cross sections of different trenches of the trenches provided in the substrate 110 may be the same or different.

It should be noted that, in the embodiment of the present disclosure, a depth and width of the trench provided in the substrate 110 may be flexibly set according to actual needs. In the embodiment of the present disclosure, a thickness of the substrate 110 may also be flexibly set according to actual needs. For example, when the thickness of the substrate 110 is too thick to meet needs, thinning processing may be performed on the substrate 110.

It should be noted that, a size of a cross section of the trench provided in the substrate 110 is not limited in the embodiment of the present disclosure. For example, the trench provided in the substrate 110 may be a hole with a small difference between a length and a width of the cross section, or a trench with a great difference between a length and a width, or a pillar-shaped (Pillar) or a wall-shaped (Wall) 3D structure. Here, the cross section may be understood as a section parallel to the surfaces of the substrate, and FIG. 1 shows a section along a longitudinal direction of the substrate.

Preferably, the trench provided in the substrate 110 has a high aspect ratio.

It should be understood that an insulating layer in the embodiment of the present disclosure may also be referred to as a dielectric layer.

Optionally, materials of the first electrode 130 and the second electrode 140 may be various conductive materials, such as a metal of copper. Optionally, materials of the third electrode 180 and the fourth electrode 190 may also be various conductive materials, such as a metal of copper.

Optionally, the first trench 10 may be a plurality of adjacent trenches, or one trench, and the embodiment of the present disclosure is described only by an example that two adjacent trenches are the first trench 10. Similarly, the second trench 40 may also be a plurality of adjacent trenches, or one trench, and the embodiment of the present disclosure is described only by an example that two adjacent trenches are the second trench 40.

Optionally, in the embodiment of the present disclosure, in the laminated structure 120, the each conductive layer is in direct contact with the dielectric layer through the high work function (high work function) conductive material included therein.

Optionally, the first threshold value is 9. That is, in the laminated structure 120, each of the m dielectric layer(s) includes at least one high-k insulating material with a relative dielectric constant k greater than or equal to 9.

Optionally, the high-k insulating material includes at least one of:

$Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, and $CaCu_3Ti_4O_{12}$.

That is, in the laminated structure 120, the dielectric layer may be an insulating material, or a combination or a laminated layer of multiple insulating materials, and includes at least one high-k material with a relative dielectric constant k greater than or equal to 9, including $Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, or $CaCu_3Ti_4O_{12}$. The specific insulating material and a layer thickness may be adjusted according to needs of the capacitor, such as a capacitance value, a frequency characteristic, and the loss. Certainly, the dielectric layer may further include some other insulating materials, which is not limited in the embodiment of the present disclosure.

Optionally, the second threshold value is 4.9 eV. That is, in the laminated structure 120, each of the n conductive layers includes at least one high work function conductive material with a work function greater than or equal to 4.9 eV.

Optionally, the high work function conductive material includes at least one of: platinum, iridium, nickel, gold, cobalt, rhodium, osmium, beryllium, palladium, platinum silicide, iridium silicide, nickel silicide, gold silicide, cobalt silicide, rhodium silicide, osmium silicide, beryllium silicide, and palladium silicide.

Optionally, each of the n conductive layers further includes at least one of: a conductive material used as an adhesion layer and/or a barrier layer, and a metal of tungsten and/or copper for increasing a thickness of a conductive layer.

That is, in the laminated structure 120, the conductive layer may be a conductive material, or a combination or a laminated layer of multiple conductive materials, and at least includes a high work function conductive material with a work function greater than 4.9 eV, including platinum (Pt), iridium (Ir), nickel (Ni), gold (Au), cobalt (Co), rhodium (Rh), osmium (OS), beryllium (Be), palladium (Pd), and a silicide of the above materials. The high work function conductive material is in direct contact with the dielectric layer. The conductive layer may further include a conductive material used as an adhesion layer and/or a barrier layer, including TiN, TaN, TiAlN, TaSiN, TaCN, Ru, $RuO_2$, $IrO_2$, or $PtO_x$. The conductive layer may further contain tungsten (W) and copper (Cu) with low resistivity for increasing a thickness of the conductive layer and further reducing a resistance.

Optionally, in the embodiment of the present disclosure, the first electrode 130 is electrically connected to all the odd-numbered conductive layer(s) of the n conductive layers provided in the first trench 10 through at least one first via structure 20. Certainly, the first electrode 130 may also be electrically connected to all the odd-numbered conductive layer(s) of the n conductive layers provided in the first trench 10 through a metal interconnection structure, which is not limited in the embodiment of the present disclosure.

It should be noted that the same material as the first electrode 130 is provided in the at least one first via structure 20, thereby achieving the purpose of electrically connecting the first electrode 130 and all the odd-numbered conductive layer(s) of the n conductive layers provided in the first trench 10. Certainly, another conductive material may also be provided in the at least one first via structure 20 to achieve the purpose of electrically connecting the first electrode 130 to all the odd-numbered conductive layer(s) of the n conductive layers provided in the first trench 10.

It should be understood that the shape and number of the at least one first via structure 20 may be specifically determined according to manufacturing processes of the capacitor 100, which is not limited in the embodiment of the present disclosure.

Optionally, in the embodiment of the present disclosure, the second electrode 140 is electrically connected to the even-numbered conductive layer(s) of the n conductive layers provided in the first trench 10 through at least one second via structure 30. Certainly, the second electrode 140 may also be electrically connected to the even-numbered conductive layer(s) of the n conductive layers provided in the first trench 10 through a metal interconnection structure, which is not limited in the embodiment of the present disclosure.

It should be noted that the same material as the second electrode 140 is provided in the at least one second via structure 30, thereby achieving the purpose of electrically connecting the second electrode 140 to the even-numbered conductive layer(s) of the n conductive layers provided in the first trench 10. Certainly, another conductive material may also be provided in the at least one second via structure 30 to achieve the purpose of electrically connecting the second electrode 140 to the even-numbered conductive layer(s) of the n conductive layers provided in the first trench 10.

It should be understood that the shape and number of the at least one second via structure 30 may be specifically determined according to manufacturing processes of the capacitor 100, which is not limited in the embodiment of the present disclosure.

Optionally, in the embodiment of the present disclosure, the third electrode 180 may also be electrically connected to all the odd-numbered conductive layer(s) of the n conductive layers provided in the second trench 40 through at least one third via structure 50. The fourth electrode 190 may also be electrically connected to all the even-numbered conductive layer(s) of the n conductive layers provided in the second trench 40 through at least one fourth via structure 60.

It should be noted that the specific provision manners of the at least one third via structure 50 and the at least one fourth via structure 60 may refer to the first via structure 20 or the second via structure 30, which will not be repeated redundantly herein.

Optionally, the laminated structure 120 is provided with a step structure, and the at least one first via structure 20 is provided on the step structure so that the first electrode 130 is electrically connected to all the odd-numbered conductive layer(s) of the n conductive layers through the at least one first via structure 20; and the at least one second via structure 30 is also provided on the step structure so that the second electrode 140 is electrically connected to all the even-numbered conductive layer(s) of the n conductive layers through the at least one second via structure 30. The provision of the third via structure 50 and the fourth via structure 60 is similar to that of the first via structure 20 and the second via structure 30.

It should be noted that the provision of the step structure facilitates connection and isolation between different conductive layers.

Optionally, in the embodiment of the present disclosure, the capacitor 100 further includes: a substrate insulating layer 150 provided between the laminated structure 120 and the substrate 110.

Optionally, a material of the substrate insulating layer 150 may be a silicon oxide, or a silicon nitride.

Optionally, in the embodiment of the present disclosure, it is assumed that m=2, n=3, that is, the laminated structure 120 may include three conductive layers, such as a first conductive layer 121, a second conductive layer 122 and a third conductive layer 123 shown in FIG. 1 and FIG. 2, and two dielectric layers, such as a first dielectric layer 124 and a second dielectric layer 125 shown in FIG. 1 and FIG. 2.

It should be noted that m=2 and n=3 are merely examples, and in the embodiment of the present disclosure, n may be an integer greater than or equal to 2, such as 5, or 10, which is not limited in the embodiment of the present disclosure.

Optionally, as shown in FIG. 1, the first conductive layer 121 is provided above the substrate 110 and in the first trench 10 and the second trench 40; the second conductive layer 122 is provided above the substrate 110 and in the first trench 10 and the second trench 40, and the second conductive layer 122 is provided above the first conductive layer 121; the first dielectric layer 124 is provided between the first conductive layer 121 and the second conductive layer 122 to isolate the first conductive layer 121 from the second conductive layer 122; the third conductive layer 123 is provided above the substrate 110 and in the first trench 10 and the second trench 40, and the third conductive layer 123 is provided above the second conductive layer 122; and the second dielectric layer 125 is provided between the second conductive layer 122 and the third conductive layer 123 to isolate the second conductive layer 122 from the third conductive layer 123.

It should be noted that, as shown in FIG. 1, the laminated structure 120 provided in the first trench 10 and the laminated structure 120 provided in the second trench 40 share the first conductive layer 121, and other conductive layers and dielectric layers are not connected.

Optionally, as shown in FIG. 2, the first conductive layer 121 is provided above the substrate 110 and in the first trench 10 and the second trench 40; the substrate insulating layer 150 is provided between the substrate 110 and the first conductive layer 121; the second conductive layer 122 is provided above the substrate 110 and in the first trench 10 and the second trench 40, and the second conductive layer 122 is provided above the first conductive layer 121; the first dielectric layer 124 is provided between the first conductive layer 121 and the second conductive layer 122 to isolate the first conductive layer 121 from the second conductive layer 122; the third conductive layer 123 is provided above the substrate 110 and in the first trench 10 and the second trench 40, and the third conductive layer 123 is provided above the second conductive layer 122; and the second dielectric layer 125 is provided between the second conductive layer 122 and the third conductive layer 123 to isolate the second conductive layer 122 from the third conductive layer 123.

It should be noted that, as shown in FIG. 2, the laminated structure 120 provided in the first trench 10 and the laminated structure 120 provided in the second trench 40 share the first conductive layer 121, and other conductive layers and dielectric layers are not connected.

It should be noted that the provision of the substrate insulating layer 150 between the substrate 110 and the first conductive layer 121 can play a role of electrically isolating the substrate 110 from the first conductive layer 121, thereby avoiding the effect of the substrate 110 on the laminated structure 120.

Optionally, the capacitor 100 further includes: an etching stop layer 160 and an interlayer dielectric layer 170. Specifically, as shown in FIG. 1 and FIG. 2, the etching stop layer 160 is provided above the substrate 110 and the third conductive layer 123; and the interlayer dielectric layer 170 is provided on an upper surface of the etching stop layer 160.

Optionally, in some embodiments, the first electrode 130, the second electrode 140, the third electrode 180 and the fourth electrode 190 may be formed of an electrode layer, the electrode layer is provided above the laminated structure 120 and the substrate 110, the electrode layer includes a first conductive region, a second conductive region and a third conductive region separated from each other, the first conductive region forms the first electrode 130 (the third electrode 180), the second conductive region forms the second electrode 140, and the third conductive region forms the fourth electrode 190. That is, the first electrode 130 (the third electrode 180), the second electrode 140 and the fourth electrode 190 may be formed by etching once, which reduces etching steps.

Specifically, as shown in FIG. 1 and FIG. 2, the electrode layer is provided above the interlayer dielectric layer 170, the first electrode 130 is electrically connected to the first conductive layer 121 and the third conductive layer 123 in the first trench 10 through the first via structures 20, the second electrode 140 is electrically connected to the second conductive layer 122 in the first trench 10 through the second via structure 30, the third electrode 180 is electrically connected to the first conductive layer 121 and the third conductive layer 123 in the second trench 40 through the third via structures 50, and the fourth electrode 190 is electrically connected to the second conductive layer 122 in the second trench 40 through the fourth via structure 60.

Specifically, the first via structures 20 is provided in the interlayer dielectric layer 170 and penetrates the etching stop layer 160, and the same material as the electrode layer is provided in the first via structures 20 so that the first electrode 130 is electrically connected to the first conductive layer 121 and the third conductive layer 123 in the first trench 10 through the first via structures 20; the second via structure 30 is provided in the interlayer dielectric layer 170 and penetrates the etching stop layer 160, and the same material as the electrode layer is provided in the second via structure 30 so that the second electrode 140 is electrically connected to the second conductive layer 122 in the first trench 10 through the second via structure 30; the third via structures 50 is provided in the interlayer dielectric layer 170 and penetrates the etching stop layer 160, and the same material as the electrode layer is provided in the third via structures 50 so that the third electrode 180 is electrically connected to the first conductive layer 121 and the third conductive layer 123 in the second trench 40 through the third via structures 50; and the fourth via structure 60 is provided in the interlayer dielectric layer 170 and penetrates the etching stop layer 160, and the same material as the electrode layer is provided in the fourth via structure 60 so that the fourth electrode 190 is electrically connected to the second conductive layer 122 in the second trench 40 through the fourth via structure 60.

It should be noted that the etching stop layer 160 is more resistant to etching than the interlayer dielectric layer 170. When etching the via structures, bottoms of the via structures may stay on different depths of the etching step layer, and then parts of the etching stop layer 160 exposed at the bottoms of the via structures are removed by a dry or wet process so that the via structures penetrate the etching stop layer 160. For example, a material of the interlayer dielectric layer 170 is silicon dioxide, and a material of the etching stop layer 160 is silicon nitride.

Therefore, the provision of the etching stop layer may control an etching process better to form the via structures.

Optionally, the material of the interlayer dielectric layer 170 may be an organic polymer material, including polyimide parylene, benzocyclobutene (BCB), or the like; or some inorganic materials, including spin on glass (SOG), undoped silicon glass (USG), boro-silicate glass (BSG), phospho-silicate glass (PSG), boro-phospho-silicate glass (BPSG), a silicon oxide synthesized from tetraethyl orthosilicate (TEOS), a silicon oxide or nitride, or ceramic; or a combination of the above materials.

In a specific implementation, in the capacitor 100 (n=3) as shown in FIG. 1 and FIG. 2, a first trench 10 and a second trench 40 are provided. In the first trench 10, the first conductive layer 121, the first dielectric layer 124 and the second conductive layer 122 may constitute a capacitor A (capacitance C1), the second conductive layer 122, the second dielectric layer 125 and the third conductive layer 123 may constitute a capacitor B (capacitance C2), the capacitor A and the capacitor B are connected in parallel, and equivalent capacitance of the capacitor A and the capacitor B in parallel is Ci=C1+C2; and in the second trench 40, the first conductive layer 121, the first dielectric layer 124 and the second conductive layer 122 may constitute a capacitor C (capacitance C3), the second conductive layer 122, the second dielectric layer 125 and the third conductive layer 123 may constitute a capacitor D (capacitance C4), the capacitor C and the capacitor D are connected in parallel, and equivalent capacitance of the capacitor C and the capacitor D in parallel is Cj=C3+C4. Therefore, capacitance C of the capacitor 100 may be capacitance after the equivalent capacitance Ci and the equivalent capacitance Cj are connected in series.

Optionally, in some embodiments, the first electrode 130 is provided below the substrate 110, and the second electrode 140 is provided above the laminated structure 120 and the substrate 110. Optionally, the third electrode 180 and the first electrode 130 are the same electrode, and the fourth electrode 190 is also provided above the laminated structure 120 and the substrate 110.

Optionally, it is assumed that m=2, n=3, that is, the laminated structure 120 may include three conductive layers, such as a first conductive layer 121, a second conductive layer 122 and a third conductive layer 123 shown in FIG. 3, and two dielectric layers, such as a first dielectric layer 124 and a second dielectric layer 125 shown in FIG. 3.

It should be noted that m=2 and n=3 are merely examples, and in the embodiment of the present disclosure, n may be an integer greater than or equal to 2, such as 5, or 10, which is not limited in the embodiment of the present disclosure.

Optionally, as shown in FIG. 3, the first conductive layer 121 is provided above the substrate 110 and in the first trench 10 and the second trench 40; the second conductive layer 122 is provided above the substrate 110 and in the first trench 10 and the second trench 40, and the second conductive layer 122 is provided above the first conductive layer 121; the first dielectric layer 124 is provided between the first conductive layer 121 and the second conductive layer 122 to isolate the first conductive layer 121 from the second conductive layer 122; the third conductive layer 123 is provided above the substrate 110 and in the first trench 10 and the second trench 40, and the third conductive layer 123 is provided above the second conductive layer 122; and the second dielectric layer 125 is provided between the second conductive layer 122 and the third conductive layer 123 to isolate the second conductive layer 122 from the third conductive layer 123.

It should be noted that, as shown in FIG. 3, the laminated structure 120 provided in the first trench 10 and the laminated structure 120 provided in the second trench 40 share the first conductive layer 121, and other conductive layers and dielectric layers are not connected.

It should be understood that, in the capacitor shown in FIG. 3, the provision of the etching stop layer 160 and the interlayer dielectric layer 170 is the same as the provision of the capacitors shown in FIG. 1 and FIG. 2, which will not be repeated redundantly herein.

Optionally, as shown in FIG. 3, an electrode layer is provided above the interlayer dielectric layer 170, the electrode layer includes a first conductive region, a second conductive region and a third conductive region separated from each other, the first conductive region is electrically connected to the first conductive layer 121 and the third conductive layer 123 in the first trench 10 through a first via structures 20, and the first conductive region is electrically connected to the first conductive layer 121 and the third conductive layer 123 in the second trench 40 through a third via structures 50; and the second conductive region forms the second electrode 140, and the third conductive region forms the fourth electrode 190. The first electrode 130 (the third electrode 180) are provided below the substrate 110, the first electrode 130 (the third electrode 180) is electrically connected to the first conductive layer 121 through the substrate 110, and the first electrode 130 (the third electrode 180) is electrically connected to the third conductive layer 123 through the substrate 110, the first conductive layer 121 and the first conductive region. The second electrode 140 is provided above the interlayer dielectric layer 170, and the second electrode 140 is electrically connected to the second conductive layer 122 in the first trench 10 through a second via structure 30. The fourth electrode 190 is provided above the interlayer dielectric layer 170, and the fourth electrode 190 is electrically connected to the second conductive layer 122 in the second trench 40 through a fourth via structure 60.

Specifically, the first via structures 20 is provided in the interlayer dielectric layer 170 and penetrates the etching stop layer 160, and the same material as the electrode layer is provided in the first via structures 20 so that the first conductive region is electrically connected to the first conductive layer 121 and the third conductive layer 123 through the first via structures 20; the second via structure 30 is provided in the interlayer dielectric layer 170 and penetrates the etching stop layer 160, and the same material as the second electrode 140 is provided in the second via structure 30 so that the second electrode 140 is electrically connected to the second conductive layer 122 through the second via structure 30; the third via structures 50 is provided in the interlayer dielectric layer 170 and penetrates the etching stop layer 160, and the same material as the electrode layer is provided in the third via structures 50 so that the first conductive region is electrically connected to the first conductive layer 121 and the third conductive layer 123 in the second trench 40 through the third via structures 50; and the fourth via structure 60 is provided in the interlayer dielectric layer 170 and penetrates the etching stop layer 160, and the same material as the electrode layer is provided in the fourth via structure 60 so that the fourth electrode 190 is electrically connected to the second conductive layer 122 in the second trench 40 through the fourth via structure 60.

It should be noted that the etching stop layer 160 is more resistant to etching than the interlayer dielectric layer 170. When etching the via structures, bottoms of the via structures may stay on different depths of the etching step layer, and then parts of the etching stop layer 160 exposed at the bottoms of the via structures are removed by a dry or wet process so that the via structures penetrate the etching stop layer 160. For example, the material of the interlayer dielectric layer 170 is silicon dioxide, and the material of the etching stop layer 160 is silicon nitride.

Therefore, the provision of the etching stop layer may control an etching process better to form the via structures.

It should be noted that, in the capacitor 100 as shown in FIG. 3, the substrate 110 may be a high-doped, low-resistivity silicon wafer.

In a specific implementation, in the capacitor 100 as shown in FIG. 3 (n=3), a first trench 10 and a second trench 40 are provided. In the first trench 10, the first conductive layer 121, the first dielectric layer 124 and the second conductive layer 122 may constitute a capacitor A (capacitance C1), the second conductive layer 122, the second dielectric layer 125 and the third conductive layer 123 may constitute a capacitor B (capacitance C2), the capacitor A and the capacitor B are connected in parallel, and equivalent capacitance of the capacitor A and the capacitor B in parallel is Ci=C1+C2; and in the second trench 40, the first conductive layer 121, the first dielectric layer 124 and the second conductive layer 122 may constitute a capacitor C (capacitance C3), the second conductive layer 122, the second dielectric layer 125 and the third conductive layer 123 may constitute a capacitor D (capacitance C4), the capacitor C and the capacitor D are connected in parallel, and equivalent capacitance of the capacitor C and the capacitor D in parallel is Cj=C3+C4. Therefore, capacitance C of the capacitor 100 may be capacitance after the equivalent capacitance Ci and the equivalent to capacitance Cj are connected in series.

Optionally, in the embodiment of the present disclosure, the laminated structure 120 provided in the first trench 10 and the laminated structure 120 provided in the second trench 40 may be different, that is, the laminated structure 120 provided in the first trench 10 and the laminated structure 120 provided in the second trench 40 may correspond to different values of m and n.

Therefore, in a capacitor provided in the embodiment of the present disclosure, a laminated structure that a conductive layer and a dielectric layer are alternately stacked is adopted and provided above a substrate and in a trench, which could obtain a great capacitance value in a case of a small device size, thereby improving a capacitance value density of the capacitor. Further, in the laminated structure, each dielectric layer includes at least one high-k insulating material with a relative dielectric constant k greater than or equal to a first threshold value, and each conductive layer includes at least one high work function conductive material with a work function greater than or equal to a second threshold value, thereby improving performance of the capacitor.

The capacitors according to the embodiments of the present disclosure are described above, and a method for producing a capacitor according to an embodiment of the present disclosure will be described below. The method for producing a capacitor according to the embodiment of the present disclosure may produce the capacitors according to the foregoing embodiments of the present disclosure, and relevant descriptions in the following embodiment and the foregoing embodiments may refer to each other.

A manufacturing method for a capacitor according to an embodiment of the present disclosure will be introduced in detail hereinafter with reference to FIG. 4 and FIG. 5.

It should be understood that FIG. 4 and FIG. 5 are schematic flow charts of a manufacturing method for a capacitor according to an embodiment of the present disclosure, but these steps or operations are merely examples, and other operations or variations of each operation in FIG. 4 and FIG. 5 may also be performed in the embodiment of the present disclosure.

FIG. 4 illustrates a schematic flow chart of a manufacturing method 200 for a capacitor according to an embodiment of the present disclosure. It should be understood that FIG. 4 is described by an example that a first trench 10 and a second trench 40 are etched simultaneously, a laminated structure 120 is produced in the first trench 10 and the second trench 40, and a first electrode 130, a second electrode 140, a third electrode 180 and a fourth electrode 190 are produced simultaneously. Certainly, in the embodiment of the present disclosure, it is also possible to etch only the first trench 10, produce the laminated structure in the first trench 10, and produce the first electrode 130 and the second electrode 140. The specific manufacturing method only needs to omit the relevant description about the second trench 40 and electrodes corresponding to the second trench 40 in the method 200.

Specifically, as shown in FIG. 4, the manufacturing method 200 for a capacitor includes the following steps.

Step 201, a first trench and a second trench are produced on a substrate, where the first trench and the second trench enter the substrate downward from an upper surface of the substrate.

It should be noted that depths of the first trench and the second trench are less than a thickness of the substrate. That is, the first trench and the second trench do not penetrate the substrate.

Optionally, a substrate 110 may be processed by exposure and development in combination with a semiconductor processing process of dry etching or wet corrosion, to form the first trench 10 and the second trench 40 in the substrate. The substrate 110 may also be processed by laser drilling or nanoimprinting to form the first trench 10 and the second trench 40 in the substrate.

Optionally, the substrate 110 may be a silicon wafer, including monocrystalline silicon, polycrystalline silicon, and amorphous silicon. The substrate 110 may also be another semiconductor substrate, including an SOI wafer, or a compound semiconductor wafer of an III-V group element, such as silicon carbide (SiC), gallium nitride (GaN), or gallium arsenide (GaAs); a glass substrate; or an organic polymer substrate.

Preferably, the first trench 10 and the second trench 40 have high aspect ratios.

Figure 5A:
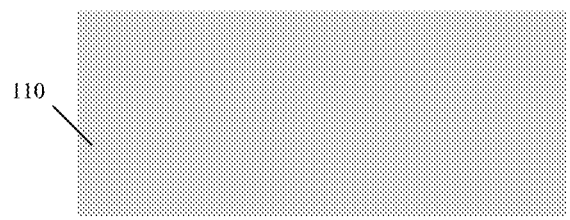
FIG. 5*a* to FIG. 5*n* are schematic diagrams of a manufacturing method for a capacitor according to an embodiment of the present disclosure.
Figure 5B:
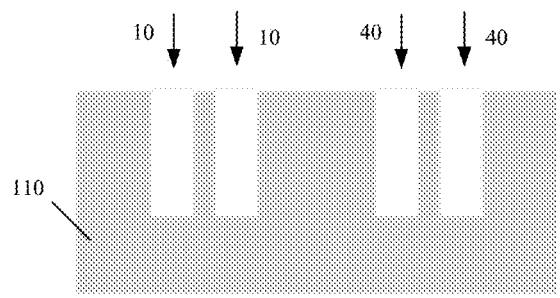

Specifically, first, the substrate 110 as shown in FIG. 5a is processed to form the first trench 10 and the second trench 40 in the substrate 110, as shown in FIG. 5b.

Step 202, a laminated structure is produced above the substrate and in the first trench and the second trench, where the laminated structure includes m dielectric layer(s) and n conductive layers, the m dielectric layer(s) and the n conductive layers form a structure that a conductive layer and a dielectric layer are adjacent to each other so that a corresponding dielectric layer of the m dielectric layer(s) isolates the n conductive layers from each other, each of the m dielectric layer(s) includes at least one high-k insulating material with a relative dielectric constant k greater than or equal to a first threshold value, and each conductive layer of the n conductive layers includes at least one high work function conductive material with a work function greater than or equal to a second threshold value, where m and n are positive integers.

It should be noted that there is no conductive layer electrically connected between the laminated structure located in the second trench and the laminated structure located in the first trench, or there is a conductive layer partially electrically connected between the laminated structure located in the second trench and the laminated structure located in the first trench.

Optionally, m=2, and n=3, that is, a laminated structure 120 includes: a first conductive layer 121, a second conductive layer 122, a third conductive layer 123, a first dielectric layer 124, and a second dielectric layer 125.

Figure 5C:
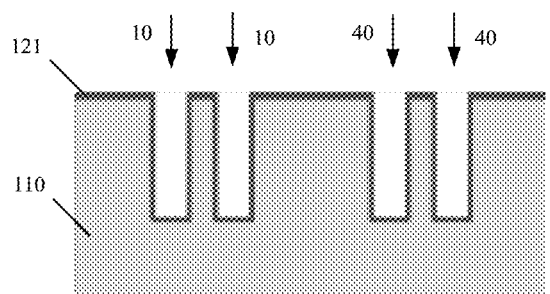
Figure 5D:
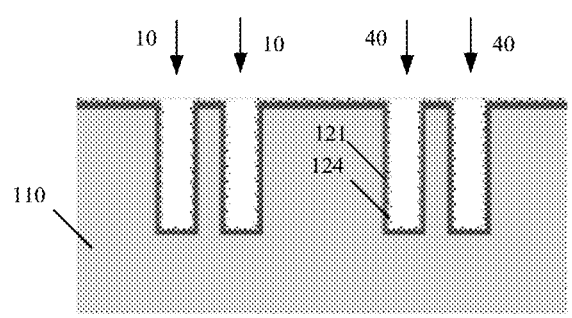
Figure 5E:
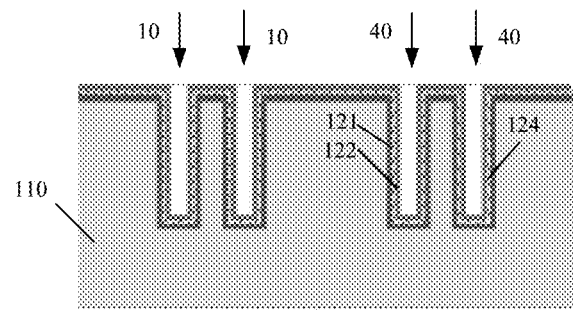
Figure 5F:
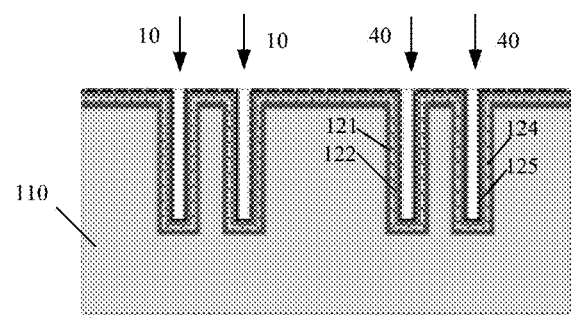
Figure 5G:
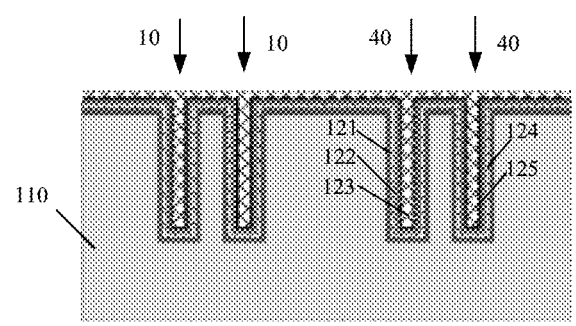
Figure 5H:
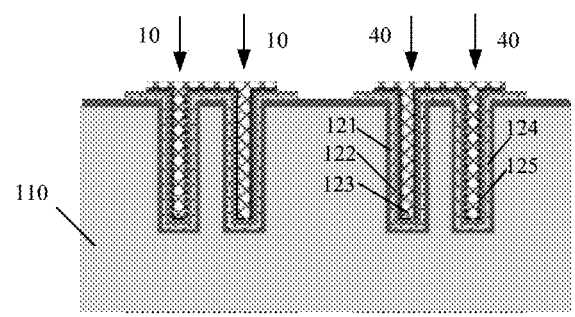

Specifically, first, in a structure as shown in FIG. 5b, a conductive material is deposited on an upper surface of the substrate 110 and inner surfaces of the first trench 10 and the second trench 40 to form the first conductive layer 121, as shown in FIG. 5c. Next, an insulating material is deposited on an upper surface and an inner surface of the first conductive layer 121 to form the first dielectric layer 124, as shown in FIG. 5d. Then, a conductive material is deposited on an upper surface and an inner surface of the first dielectric layer 124 to form the second conductive layer 122, as shown in FIG. 5e. Then, an insulating material is deposited on an upper surface and an inner surface of the second conductive layer 122 to form the second dielectric layer 125, as shown in FIG. 5f. Then, a conductive material is deposited on an upper surface and an inner surface of the second dielectric layer 125 to form the third conductive layer 123, as shown in FIG. 5g. Finally, multi-step photolithography processing is performed on the second conductive layer 122, the third conductive layer 123, the first dielectric layer 124 and the second dielectric layer 125 to form a step structure and expose the upper surfaces of the first conductive layer 121 and the second conductive layer 122, as shown in FIG. 5h.

It should be understood that after the multi-step photolithography processing, the pattern shapes of the second conductive layer 122, the third conductive layer 123, the first dielectric layer 124 and the second dielectric layer 125 remained may be designed according to capacitor specification needs, and description will not be elaborated here.

Optionally, the first conductive layer 121, the second conductive layer 122 and the third conductive layer 123 may be deposited by means of atomic layer deposition (ALD), chemical vapor deposition (CVD), or the like. Similarly, the first dielectric layer 124 and the second dielectric layer 125 may also be deposited by means of atomic layer deposition (ALD), chemical vapor deposition (CVD), or the like.

It should be noted that deposition processes for different dielectric layers of the m dielectric layer(s) may be the same or different, which is not limited in the embodiment of the present disclosure. Similarly, deposition processes for different conductive layers of the n dielectric layers may be the same or different, which is not limited in the embodiment of the present disclosure.

Optionally, the first conductive layer 121 is in direct contact with the first dielectric layer 124 through a high work function conductive material included therein. Similarly, the second conductive layer 122 is in direct contact with the first dielectric layer 124 and the second dielectric layer 125 through a high work function conductive material included therein, and the third conductive layer 123 is in direct contact with the second dielectric layer 125 through a high work function conductive material included therein.

Optionally, the first threshold value is 9. That is, the first dielectric layer 124 and the second dielectric layer 125 include at least one high-k insulating material with a relative dielectric constant k greater than or equal to 9.

Optionally, the high-k insulating material includes at least one of:

$Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, and $CaCu_3Ti_4O_{12}$.

That is, the first dielectric layer 124 and/or the second dielectric layer 125 may be an insulating material, or a combination or a laminated layer of multiple insulating materials, and includes at least one high-k material with a relative dielectric constant k greater than or equal to 9, including $Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, or $CaCu_3Ti_4O_{12}$. The specific insulating material and a thickness of a dielectric layer may be adjusted according to needs of the capacitor, such as a capacitance value, a frequency characteristic, and the loss. Certainly, the first dielectric layer 124 and/or the second dielectric layer 125 may further include some other insulating materials, which is not limited in the embodiment of the present disclosure.

Optionally, the second threshold value is 4.9 eV. That is, the first conductive layer 121, the second conductive layer 122 and the third conductive layer 123 include at least one high work function conductive material with a work function greater than or equal to 4.9 eV.

Optionally, the high work function conductive material includes at least one of: platinum, iridium, nickel, gold, cobalt, rhodium, osmium, beryllium, palladium, platinum silicide, iridium silicide, nickel silicide, gold silicide, cobalt silicide, rhodium silicide, osmium silicide, beryllium silicide, and palladium silicide.

Optionally, the first conductive layer 121 and/or the second conductive layer 122 and/or the third conductive layer 123 further includes at least one of: a conductive material used as an adhesion layer and/or a barrier layer, and a metal of tungsten and/or copper for increasing a thickness of a conductive layer.

That is, the first conductive layer 121 and/or the second conductive layer 122 and/or the third conductive layer 123 may be a conductive material, or a combination or a laminated layer of multiple conductive materials, and at least includes a high work function conductive material with a work function greater than 4.9 eV, including platinum (Pt), iridium (Ir), nickel (Ni), gold (Au), cobalt (Co), rhodium (Rh), osmium (OS), beryllium (Be), palladium (Pd), and silicide of the above materials. The high work function conductive material is in direct contact with the dielectric layer. The first conductive layer 121 and/or the second conductive layer 122 and/or the third conductive layer 123 may further include a conductive material used as an adhesion layer and/or a barrier layer, including TiN, TaN, TiAlN, TaSiN, TaCN, Ru, $RuO_2$, $IrO_2$, or $PtO_x$. The first conductive layer 121 and/or the second conductive layer 122 and/or the third conductive layer 123 may further contain tungsten (W) and copper (Cu) with low resistivity for increasing a thickness of the conductive layer and further reducing a resistance. The specific conductive material and the thickness of the conductive layer may be adjusted according to needs of the capacitor, such as a capacitance value, a frequency characteristic, and the loss.

It should be noted that materials of different dielectric layers of the m dielectric layer(s) may be the same or different, which is not limited in the embodiment of the present disclosure. Similarly, materials of different conductive layers of the n dielectric layers may be the same or different, which is not limited in the embodiment of the present disclosure.

Step 203, a first electrode, a second electrode, a third electrode and a fourth electrode are produced, where the first electrode is electrically connected to all odd-numbered conductive layer(s) of the n conductive layers located in the first trench, the second electrode is electrically connected to an even-numbered conductive layer(s) of the n conductive layers located in the first trench, the third electrode is electrically connected to all the odd-numbered conductive layer(s) of the n conductive layers located in the second trench, and the fourth electrode is electrically connected to the even-numbered conductive layer(s) of the n conductive layers located in the second trench.

Optionally, the third electrode 180 and the first electrode 130 are the same electrode, and the fourth electrode 190 and the second electrode 140 are the same electrode. That is, an equivalent capacitance formed by the laminated structure 120 provided in the first trench 10 and an equivalent capacitance formed by the laminated structure 120 provided in the second trench 40 are connected in parallel.

Optionally, the third electrode 180 and the first electrode 130 are different electrodes, and the fourth electrode 190 and the second electrode 140 are the same electrode. That is, an equivalent capacitance formed by the laminated structure 120 provided in the first trench 10 and an equivalent capacitance formed by the laminated structure 120 provided in the second trench 40 are connected in series.

Optionally, the third electrode 180 and the first electrode 130 are the same electrode, and the fourth electrode 190 and the second electrode 140 are different electrodes. That is, an equivalent capacitance formed by the laminated structure 120 provided in the first trench 10 and an equivalent capacitance formed by the laminated structure 120 provided in the second trench 40 are connected in series.

Optionally, the third electrode 180 and the first electrode 130 are different electrodes, and the fourth electrode 190 and the second electrode 140 are different electrodes. That is, an equivalent capacitance formed by the laminated structure 120 provided in the first trench 10 and an equivalent capacitance formed by the laminated structure 120 provided in the second trench 40 are two independent capacitors.

Specifically, the capacitors as shown in FIG. 1, FIG. 2 and FIG. 3 may be produced based on the above steps 201 to 203.

It should be understood that an upper surface of each material layer in the steps 201 to 203 refers to a surface of the material layer substantially parallel to the upper surface of the substrate, and an inner surface of each material layer refers to an upper surface of the material layer located in the trench. The upper surface and the inner surface may be regarded as a whole.

Optionally, in some embodiments, the method 200 further includes:

producing at least one first via structure 20 so that the first electrode 130 is electrically connected to all the odd-numbered conductive layer(s) of the n conductive layers located in the first trench 10 through the at least one first via structure 20.

Optionally, in some embodiments, the method 200 further includes:

producing at least one second via structure 30 so that the second electrode 140 is electrically connected to all the even-numbered conductive layer(s) of then conductive layers located in the first trench 10 through the at least one second via structure 30.

Optionally, in some embodiments, the method 200 further includes:

producing at least one third via structure 50 so that the third electrode 180 is electrically connected to all the odd-numbered conductive layer(s) of the n conductive layers located in the second trench 40 through the at least one third via structure 50.

Optionally, in some embodiments, the method 200 further includes:

producing at least one fourth via structure 60 so that the fourth electrode 190 is electrically connected to all the even-numbered conductive layer(s) of then conductive layers located in the second trench 40 through the at least one fourth via structure 60.

Optionally, in some embodiments, the method 200 further includes:

producing an interconnection structure so that all the odd-numbered conductive layer(s) of the n conductive layers located in the first trench 10 is electrically connected to the first electrode 130, and/or, all the even-numbered conductive layer(s) of the n conductive layers located in the first trench 10 is electrically connected to the second electrode 140, and/or all the odd-numbered conductive layer(s) of the n conductive layers located in the second trench 40 is electrically connected to the third electrode 180, and/or, all the even-numbered conductive layer(s) of the n conductive layers located in the second trench 40 is electrically connected to the second electrode 190.

Optionally, in some embodiments, the method 200 further includes:

depositing an etching stop layer 160 above the substrate and the laminated structure, and depositing an interlayer dielectric layer 170 above the etching stop layer 160.

Figure 5I:
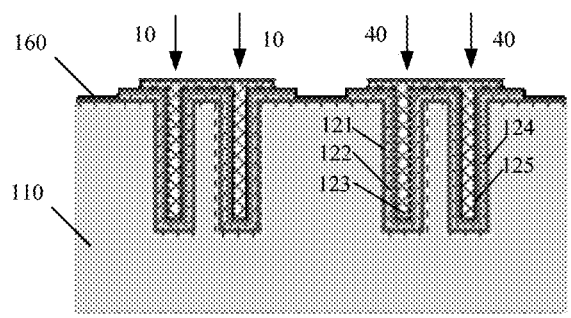
Figure 5J:
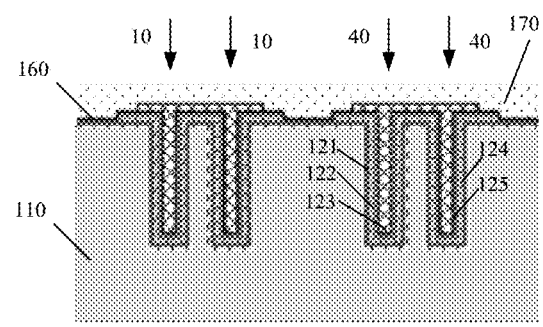

Specifically, in a structure as shown in FIG. 5h, first, the etching stop layer 160 is deposited on the upper surfaces of the first conductive layer 121, the second conductive layer 122 and the third conductive layer 123, as shown in FIG. 5i. Then, the interlayer dielectric layer 170 is deposited on an upper surface of the etching stop layer 160, as shown in FIG. 5j.

Optionally, a material of the interlayer dielectric layer 170 may be an organic polymer material, including polyimide, parylene, benzocyclobutene (BCB), or the like; or some inorganic materials, including SOG, USG, BSG, PSG, BPSG, a silicon oxide synthesized from TEOS, a silicon oxide or nitride, or ceramic; or a combination of the above materials.

Optionally, as an embodiment, the above step 203 may specifically include:

producing an electrode layer above the laminated structure and the substrate, where the electrode layer includes a first conductive region, a second conductive region and a third conductive region separated from each other, the first conductive region forms the first electrode and the third electrode, the second conductive region forms the second electrode, and the third conductive region forms the fourth electrode.

Figure 5K:
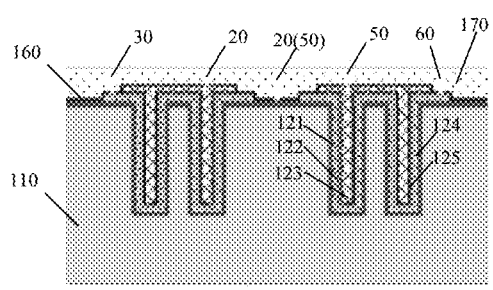
Figure 5L:
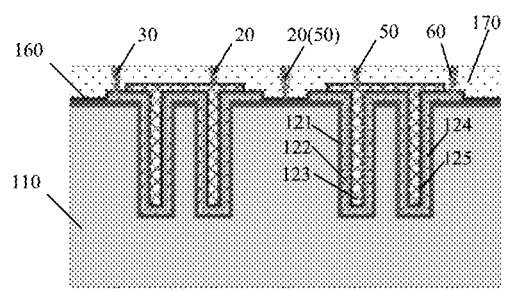

Specifically, in a structure as shown in FIG. 5j, first, the interlayer dielectric layer 170 is etched by deep reactive ion etching to form at least one first via structure 20, at least one second via structure 30, at least one third via structure 50 and at least one fourth via structure 60. In this case, bottoms of the via structures stay on the etching stop layer 160. Next, parts of the etching stop layer 160 exposed at the bottoms of the via structures are removed by a dry or wet process to expose the first conductive layer 121 and the third conductive layer 123 located in the first trench 10 at the bottom of the first via structures 20, expose the second conductive layer 122 located in the first trench 10 at the bottom of the second via structure 30, expose the first conductive layer 121 and the third conductive layer 123 located in the second trench 40 at the bottom of the third via structures 50, and expose the second conductive layer 122 located in the second trench 40 at the bottom of the fourth via structure 60, as shown in FIG. 5k. Then, a conductive material is deposited in each via structure, as shown in FIG. 5l. Finally, the electrode layer is deposited on an upper surface of the interlayer dielectric layer 170, and photolithography processing is performed on the electrode layer to form the first conductive region, the second conductive region and the third conductive region separated from each other, the first conductive region forms the first electrode 130 and the third electrode 180, the second conductive region forms the second electrode 140, and the third conductive region forms the fourth electrode 190. Thus, the capacitor as shown in FIG. 1 is produced.

It should be noted that the conductive material deposited in the via structures may be the same material as the electrode layer, and certainly, may be different from the electrode layer, which is not limited in the embodiment of the present disclosure.

It should also be noted that the etching stop layer 160 is more resistant to etching than the interlayer dielectric layer 170. When etching the via structures, the bottoms of the via structures may stay on different depths of the etching step layer 160, and then parts of the etching stop layer 160 exposed at the bottoms of the via structures are removed by a dry or wet process so that the via structures penetrate the etching stop layer 160. For example, the material of the interlayer dielectric layer 170 is silicon dioxide, and a material of the etching stop layer 160 is silicon nitride.

Therefore, the provision of the etching stop layer may control an etching process better to form the via structures.

Optionally, as another embodiment, the above step 203 may specifically include:

producing the first electrode and the third electrode below the substrate, and producing the second electrode and the fourth electrode above the laminated structure and the substrate.

Figure 5M:
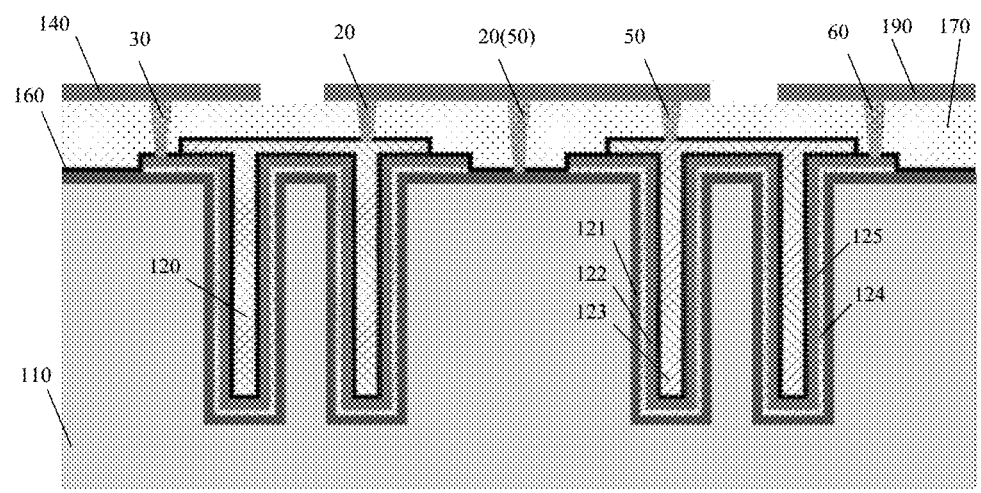

Specifically, in a structure as shown in FIG. 5l, first, an electrode material is deposited on an upper surface of the interlayer dielectric layer 170, photolithography processing is processed on the electrode material to form the first conductive region, the second conductive region and the third conductive region separated from each other, the first conductive region is electrically connected to the first conductive layer 121 and the third conductive layer 123 located in the first trench 10 through the first via structures 20, and the first conductive region is electrically connected to the first conductive layer 121 and the third conductive layer 123 located in the second trench 40 through the third via structures 50; the second conductive region forms the second electrode 140; and the third conductive region forms the fourth electrode 190, as shown in FIG. 5m. Then, an electrode material is deposited below the substrate 110 to form the first electrode 130 and the third electrode 180. Thus, the capacitor 100 as shown in FIG. 3 is produced.

That is, the first electrode 130 (the third electrode 180) may be electrically connected to the first conductive layer 121 through the substrate 110, and the first electrode 130 (the third electrode 180) is electrically connected to the second conductive layer 123 through the substrate 110, the first conductive layer 121 and the first conductive region. That is, the first electrode 130 (the third electrode 180) is electrically connected to the first conductive layer 121 and the third conductive layer 123 in the first trench 10 and the second trench 40.

It should be understood that the function of the etching stop layer may refer to the relevant description for producing the capacitor 100 as shown in FIG. 1, which will not be repeated redundantly herein.

It should be noted that, when the capacitor 100 as shown in FIG. 3 is produced, the substrate 110 may be a high-doped, low-resistivity silicon wafer.

Optionally, in some embodiments of the present disclosure, before producing the laminated structure, the method 200 further includes: depositing a substrate insulating layer on the upper surface of the substrate and an inner surface of the trench. That is, before the step 202, a substrate insulating layer is deposited on the upper surface of the substrate and the inner surfaces of the first trench and the second trench. In this case, the step 202 may be to produce the laminated structure on an upper surface and an inner surface of the substrate insulating layer.

Figure 5N:
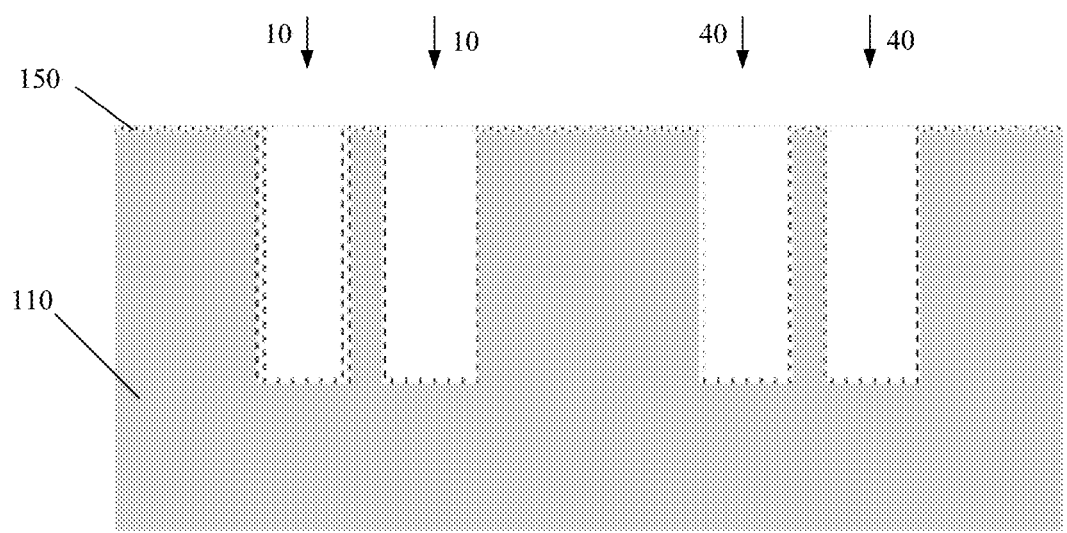

Specifically, in the structure as shown in FIG. 5b, an insulating material is deposited on the upper surface of the substrate 110 and the inner surfaces of the first trench 10 and the second trench 40 to form a substrate insulating layer 150, as shown in FIG. 5n. Then, the laminated structure 120 is produced on an upper surface and an inner surface of the substrate insulating layer 150. Subsequent flows for producing the laminated structure 120, the first electrode 130, the second electrode 140, the third electrode 180, the fourth electrode 190, the etching stop layer 160 and the interlayer dielectric layer 170 are the same as the flows for producing the capacitor 100 as shown in FIG. 1. Thus, the capacitor 100 as shown in FIG. 2 is produced.

Specifically, a layer of insulating material is grown or deposited on the upper surface of the substrate 110 and the inner surfaces of the first trench 10 and the second trench 40 to form the substrate insulating layer 150. For example, a layer of silicon oxide is grown by a thermal oxidation process to form the substrate insulating layer 150. For another example, a layer of silicon oxide, silicon nitride or silicon oxynitride is deposited by a CVD process to form the substrate insulating layer 150. For another example, a layer of aluminum oxide, silicon oxide or silicon nitride is deposited by an ALD process to form the substrate insulating layer 150. A certain material may be grown or deposited by a certain of the above processes alone; or one or more materials may be grown or deposited by one or more processes.

Therefore, in the manufacturing method for a capacitor provided in the embodiment of the present disclosure, a laminated structure including more conductive layers and dielectric layers may be obtained by means of producing a laminated structure, and a capacitance value of the capacitor is increased. Further, in the laminated structure, each dielectric layer includes at least one high-k insulating material with a relative dielectric constant k greater than or equal to a first threshold value, and each conductive layer includes at least one high work function conductive material with a work function greater than or equal to a second threshold value, thereby improving performance of the capacitor.

The manufacturing method for a capacitor according to the present disclosure will be further described below with reference to a specific embodiment. For ease of understanding, the capacitor as shown in FIG. 2 is manufactured in this embodiment. Certainly, the capacitors as shown in FIG. 1 and FIG. 3 may also be manufactured by the manufacturing method for a capacitor in the embodiment, but there is slightly different in parts, such as the provision of an electrode layer and a substrate insulating layer, which will not be repeated redundantly herein for brevity.

Step one, a monocrystalline silicon wafer is selected as a substrate. Using a Bosch process, a trench array with a high aspect ratio is processed on the substrate. A single trench has a width of 1.2 μm, a length of 20 μm, and a depth of 25 μm. An interval between trenches is 0.8 μm.

Step two: using a thermal oxidation process, silicon oxide of 150 nm is grown on the surface of the trench as a substrate insulating layer.

Step three: a capacitance film layer is deposited.

Specifically, using an ALD process, a laminated layer including a layer of TiN of 50 nm and a layer of Pt of 10 nm is deposited as a first conductive layer.

Using the ALD process, a laminated layer including a layer of $Al_2O_3$ of 1.5 nm, a layer of $HfO_2$ of 12 nm and a layer of $Al_2O_3$ of 1.5 nm is deposited as a first dielectric layer.

Using the ALD process, a layer of Pt of 25 nm is deposited as a second conductive layer.

Using the ALD process, a laminated layer including a layer of $Al_2O_3$ of 1.5 nm, a layer of $HfO_2$ of 12 nm and a layer of $Al_2O_3$ of 1.5 nm is deposited as a second dielectric layer.

First, using the ALD process, a layer of Pt of 10 nm and a layer of TiN of 25 nm are deposited; and then using a CVD process, a layer of W having a thickness of 300 nm is deposited to fill the trench. A laminated layer of the above conductive materials is used as a third conductive layer.

Step four: using a multi-step photolithography process, a step is formed, and the first and second conductive layers are exposed to form a laminated structure.

Step five: using the CVD process, a layer of silicon nitride is deposited on a surface of the step as an etching stop layer, and a layer of silicon oxide is deposited as an interlayer dielectric layer.

Step six: using a photolithography process, several via holes penetrating the interlayer dielectric layer are drilled at each step position. Since a material of the etching stop layer is more resistant to etching than the interlayer dielectric layer, a bottom of each via hole stays on the etching stop layer of a corresponding step by one etching step. Then, parts of the etching stop layer exposed at the bottoms of the via holes are removed by a dry or wet process.

Step seven: a layer of titanium nitride is deposited in the via holes and the via holes are filled with a metal of tungsten. Finally, redundant conductive materials and insulating materials on the surface are removed by a surface planarization process.

Step eight: using a PVD process, a layer of a metal of aluminum is deposited, and, a first electrode and a second electrode are formed by photolithography. The first electrode communicates with the first conductive layer and the third conductive layer, and the second electrode communicates with the second conductive layer.

That is, the capacitor as shown in FIG. 2 is produced based on the above steps one to eight.

A person skilled in the art can understand that preferred embodiments of the present disclosure are described in detail above with reference to the accompanying drawings. However, the present disclosure is not limited to specific details in the foregoing embodiments. Within the technical concept of the present disclosure, a variety of simple variants may be made to the technical solutions of the present disclosure, and these simple variants are within the protection scope of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination may be made between various embodiments of the present disclosure without departing from the idea of the present disclosure, and it should also be regarded as the disclosure of the present disclosure.

What is claimed is:

1. A capacitor, comprising:
   a substrate comprising an upper surface and a lower surface disposed oppositely;
   a first trench provided in the substrate and entering the substrate downward from the upper surface;
   a laminated structure provided above the substrate and in the first trench, the laminated structure comprising m dielectric layers and n conductive layers, the m dielectric layers and the n conductive layers forming a structure that a conductive layer and a dielectric layer are adjacent to each other so that a corresponding dielectric layer of the m dielectric layers electrically isolates the n conductive layers from each other, each of the m dielectric layers comprising at least one high-k insulating material with a relative dielectric constant k greater than or equal to a first threshold value, and each conductive layer of the n conductive layers comprising at least one high work function conductive material with a work function greater than or equal to a second threshold value, wherein m and n are positive integers;

a first electrode electrically connected to all odd-numbered conductive layers of the n conductive layers through at least one first via structure; and a second electrode electrically connected to all even-numbered conductive layers of the n conductive layers through at least one second via structure;

wherein the capacitor further comprising an etching stop layer and an interlayer dielectric layer, the etching stop layers is provided above the substrate and the n conductive layers, and the interlayer dielectric layer is provided on an upper surface of the etching stop layer;

the laminated structure is provided with a step structure, the at least one first via structure is provided on the step structure, so that the first electrode is electrically connected to the odd-numbered conductive layers of the n conductive layers through the at least one first via structure;

the at least one second via structure is provided on the step structure, so that the second electrode is electrically connected to the even-numbered conductive layers of the n conductive layers through the at least one second via structure;

the etching stop layers are more resistant to etching than the interlayer dielectric layer, when etching the via structures, bottoms of the via structures stay on different depths of the etching stop layers, and then parts of the etching stop layer exposed at the bottoms of the via structures are removed, so that the via structures penetrate the etching stop layer;

the capacitor further comprising an electrode layer, wherein the electrode layer is provided above the laminated structure and the substrate, the electrode layer comprises a first conductive region and a second conductive region separated from each other, and the first conductive region forms the first electrode, and the second conductive region forms the second electrode;

wherein the capacitor further comprises: a second trench, a third electrode, and a fourth electrode, wherein the second trench is provided in the substrate and enters the substrate downward from the upper surface;

the laminated structure is further provided in the second trench, and there is no conductive layer electrically connected between the laminated structure provided in the second trench and the laminated structure provided in the first trench, or there is an electrical connection between part of the laminated structure provided in the second trench and part of the laminated structure provided in the first trench; and the third electrode is electrically connected to all the odd-numbered conductive layers of the n conductive layers provided in the second trench, and the fourth electrode is electrically connected to all the even-numbered conductive layers of the n conductive layers provided in the second trench;

wherein the third electrode and the first electrode are the same electrode, the fourth electrode and the second electrode are the same electrode, and an equivalent capacitance formed by the laminated structure provided in the first trench and an equivalent capacitance formed by the laminated structure provided in the second trench are connected in parallel; or the third electrode and the first electrode are the same electrode, the fourth electrode and the second electrode are different electrodes, and an equivalent capacitance formed by the laminated structure provided in the first trench and an equivalent capacitance formed by the laminated structure provided in the second trench are connected in series.

2. The capacitor according to claim 1, wherein in the laminated structure, the each conductive layer is in direct contact with the dielectric layer through the high work function conductive material comprised therein.

3. The capacitor according to claim 1, wherein the first threshold value is 9.

4. The capacitor according to claim 1, wherein the second threshold value is 4.9 eV.

5. The capacitor according to claim 1, wherein the high-k insulating material comprises at least one of:
$Al_2O_3$, $HfO_2$, $ZrO_2$, $TiO_2$, $Y_2O_3$, $La_2O_3$, $HfSiO_4$, $LaAlO_3$, $BaTiO_3$, $SrTiO_3$, $LaLuO_3$, and $CaCu_3Ti_4O_{12}$.

6. The capacitor according to claim 5, wherein the high work function conductive material comprises at least one of:
platinum, iridium, nickel, gold, cobalt, rhodium, osmium, beryllium, palladium, platinum silicide, iridium silicide, nickel silicide, gold silicide, cobalt silicide, rhodium silicide, osmium silicide, beryllium silicide, and palladium silicide.

7. The capacitor according to claim 6, wherein the each conductive layer of the n conductive layers further comprises at least one of:
a conductive material used as an adhesion layer and/or a barrier layer, and a metal of tungsten and/or copper for increasing a thickness of a conductive layer.

8. The capacitor according to claim 1, wherein the capacitor further comprises:
a substrate insulating layer provided between the laminated structure and the substrate.

9. The capacitor according to claim 1, wherein the capacitor further comprises:
an interconnection structure for electrically connecting all the odd-numbered conductive layers of the n conductive layers to the first electrode, and/or electrically connecting all the even-numbered conductive layers of the n conductive layers to the second electrode.

10. The capacitor according to claim 1, wherein
the first electrode is provided below the substrate, and
the second electrode is provided above the laminated structure and the substrate.

11. A manufacturing method for a capacitor, comprising:
producing a first trench on a substrate, wherein the first trench enters the substrate downward from an upper surface of the substrate;
producing a laminated structure above the substrate and in the first trench, wherein the laminated structure comprises m dielectric layer and n conductive layers, the m dielectric layer and the n conductive layers form a structure that a conductive layer and a dielectric layer are adjacent to each other so that a corresponding dielectric layer of the m dielectric layer electrically isolates the n conductive layers from each other, each of the m dielectric layers comprises at least one high-k insulating material with a relative dielectric constant k greater than or equal to a first threshold value, and each conductive layer of the n conductive layers comprises at least one high work function conductive material with a work function greater than or equal to a second threshold value, wherein m and n are positive integers greater or equal to 1; and
producing a first electrode and a second electrode, wherein the first electrode is electrically connected to each odd-numbered conductive layer of the n conductive layers through at least one first via structure, and the second electrode is electrically connected to each even-numbered conductive layer of the n conductive layers through at least one second via structure;

producing an etching stop layer and an interlayer dielectric layer, wherein the etching stop layers is provided above the substrate and the n conductive layers, and the interlayer dielectric layer is provided on an upper surface of the etching stop layer;

producing an electrode layer, wherein the electrode layer is provided above the laminated structure and the substrate;

the laminated structure is provided with a step structure, the at least one first via structure is provided on the step structure, so that the first electrode is electrically connected to the odd-numbered conductive layers of the n conductive layers through the at least one first via structure;

the at least one second via structure is provided on the step structure, so that the second electrode is electrically connected to the even-numbered conductive layers of the n conductive layers through the at least one second via structure;

the etching stop layers are more resistant to etching than the interlayer dielectric layer, when etching the via structures, bottoms of the via structures stay on different depths of the etching stop layers, and then parts of the etching stop layer exposed at the bottoms of the via structures are removed, so that the via structures penetrate the etching stop layer;

the electrode layer comprises a first conductive region and a second conductive region separated from each other, and the first conductive region forms the first electrode, and the second conductive region forms the second electrode;

wherein the capacitor further comprises: a second trench, a third electrode, and a fourth electrode, wherein the second trench is provided in the substrate and enters the substrate downward from the upper surface;

the laminated structure is further provided in the second trench, and there is no conductive layer electrically connected between the laminated structure provided in the second trench and the laminated structure provided in the first trench, or there is an electrical connection between part of the laminated structure provided in the second trench and part of the laminated structure provided in the first trench; and the third electrode is electrically connected to all the odd-numbered conductive layers of the n conductive layers provided in the second trench, and the fourth electrode is electrically connected to all the even-numbered conductive layers of the n conductive layers provided in the second trench;

wherein the third electrode and the first electrode are the same electrode, the fourth electrode and the second electrode are the same electrode, and an equivalent capacitance formed by the laminated structure provided in the first trench and an equivalent capacitance formed by the laminated structure provided in the second trench are connected in parallel; or the third electrode and the first electrode are the same electrode, the fourth electrode and the second electrode are different electrodes, and an equivalent capacitance formed by the laminated structure provided in the first trench and an equivalent capacitance formed by the laminated structure provided in the second trench are connected in series.

12. The manufacturing method according to claim 11, wherein in the laminated structure, the each conductive layer is in direct contact with the dielectric layer through the high work function conductive material comprised therein.

13. The manufacturing method according to claim 11, wherein the first threshold value is 9.

14. The manufacturing method according to claim 13, wherein the second threshold value is 4.9 eV.

15. The manufacturing method according to claim 11, wherein before producing the laminated structure, the manufacturing method further comprises:

depositing a substrate insulating layer on the upper surface of the substrate and an inner surface of the first trench; and the producing the laminated structure above the substrate and in the first trench comprises:

producing the laminated structure on an upper surface and an inner surface of the substrate insulating layer.

* * * * *